United States Patent [19]

Etzkorn et al.

[11] Patent Number: 4,728,529
[45] Date of Patent: Mar. 1, 1988

[54] METHOD OF PRODUCING DIAMOND-LIKE CARBON-COATINGS

[75] Inventors: Heinz-Werner Etzkorn, Neu-Anspach; Werner Ronge, Mörfelden/Walldorf, both of Fed. Rep. of Germany

[73] Assignee: Battelle-Institut E.V., Frankfurt am Main, Fed. Rep. of Germany

[21] Appl. No.: 813,280

[22] PCT Filed: Jun. 7, 1985

[86] PCT No.: PCT/EP85/00275

§ 371 Date: Dec. 13, 1985

§ 102(e) Date: Dec. 13, 1985

[87] PCT Pub. No.: WO86/00093

PCT Pub. Date: Jan. 3, 1986

[51] Int. Cl.$^4$ ............................................. B05D 3/06
[52] U.S. Cl. .................................. 427/39; 427/294
[58] Field of Search .............................. 427/39, 294

[56] References Cited

U.S. PATENT DOCUMENTS 3,167,444  1/1965  Baumann ..................... 117/36.8
3,167,449  1/1965  Spacil ........................... 117/200
4,410,504  10/1983  Galasso et al. ................. 423/453
4,434,188  2/1984  Kano et al. ...................... 427/39

FOREIGN PATENT DOCUMENTS 3047888   7/1982  Fed. Rep. of Germany .
55-36980  3/1980  Japan .
2128637   5/1984  United Kingdom .

OTHER PUBLICATIONS

J. M. Mackowski, "Comparison physiochimique des couches de carbone a large bande interdite (I-C) elaborees par differentes techniques plasma" pp. 99-106.

Primary Examiner—Bernard D. Pianalto
Attorney, Agent, or Firm—Fisher, Christen & Sabol

[57] ABSTRACT

Diamond-like, transparent, clear and uncolored carbon coatings with low internal stresses are generated on substrates by plasma discharge from the gas phase. For this purpose, a hydrocarbon gas or a mixture of hydrocarbon gases and pure hydrogen is admitted onto the substrate to be coated which is at room temperature. Around the substrate an oxygen-free plasma discharge is produced by high-frequency excitation which is sustained by the gases admitted. The gases are excited, dissociated ionized and accelerated toward the substrate during plasma discharge.

14 Claims, No Drawings

METHOD OF PRODUCING DIAMOND-LIKE CARBON-COATINGS

The invention relates to a method of producing diamond-like carbon coatings in which hydrocarbons and hydrogen, possibly in the presence of a noble gas, are ionized by plasma discharge.

Diamond-like carbon coatings are used in particular for coating IR optical systems, e.g. lenses, mirrors or the like. Coating of objects like this takes place under vacuum conditions, a gas mixture consisting of hydrocarbons, e.g. acetylene, and a noble gas, e.g. argon, being exposed to a plasma discharge. The coatings thus produced are not transparent in the visible spectrum; they are of yellow, brownish, blue or black color. This is why these coatings cannot be used as scratch-resistant coatings for optical systems in the visible spectral region but only for the IR spectrum. A method of despositing a diamond-like carbon film is described in GB-A-2 128 637, in which carbon ions and other ions are generated in separate stationary sources, directed toward the surface of the substrate to be coated, and accelerated. The second ion species has the function to remove the undesired carbon modifications from the deposited coating by chemical sputtering. For this purpose hydrogen is used among other materials. The substrate is heated to a temperature of 100° to 200° C. In this way, yellow to brown-colored coatings are obtained that are likewise suitable for IR optical systems. In conventional methods that use stationary sources the substrate has to be rotated relative to the sources in order to achieve homogenous all-round coating. The simultaneous coating of a large number of parts is technologically feasible, though at a high expenditure. A further disadvantage consists in the fact that the growth rate of typically 0.1 to 1 $\mu$m that can be reached per hour is relatively low. Besides, only comparably thin coatings can be produced because the internal stresses in the diamond-like carbon coatings will lead to cracks at coating thicknesses higher than about 1 $\mu$m. Hence, these diamond-like coatings have only a very limited wear reserve, so that their application is restricted. If thicker diamond-like coatings could be produced, they would have a much wider of application.

The object of the present invention is to provide a method of producing uncolored diamond-like carbon coatings which are transparent even in the visible region and in addition show low internal stresses. Moreover, the method should permit the simultaneous homogenous all-round coating of large production volumes.

This problem has been solved by the invention in that a hydrocarbon gas or a mixture of hydrocarbon gases and pure hydrogen is passed onto the substrate to be coated which is at room temperature and that around the substrate an oxygen-free plasma discharge is produced by high-frequency excitation which is sustained by the gases admitted, the gases being excited, dissociated, ionized, and accelerated toward the substrate during the plasma discharge. The partial pressure of the hydrocarbon gas is preferably between $10^{-3}$ and 1 mbar and the ratio of the partial pressures of hydrocarbon:hydrogen ranges between 0.05 and 20, preferably between 0.5 and 10. When carrying out the process in the presence of a noble gas, preferably argon, the ratio of the partial pressures of hydrocarbon:noble gas ranges between 0.1 and 10, preferably between 1 and 5.

Coating is initiated under vacuum conditions, preferably at a residual gas pressure of below $2 \times 10^{-5}$ mbar.

Coating according to the invention is carried out without heating of the substrate being necessary prior to or during coating. The preferred substrate temperature is between 10° and 20° C. Cooling down to $-100°$ C. is possible.

Plasma discharge takes place at low voltages, e.g., between 50 and 600 V, preferably at 150 to 250 V. High-frequency excitation in the kilohertz to megahertz range, from 30 KHz to 14 MHz, is required to produce and sustain plasma discharge.

According to one embodiment of the method according to the invention, the coating process is carried out intermittently. During the temporary interruptions the hydrocarbon supply is discontinued so that the substrate is bombarded only with noble gas and/or hydrogen. This may lead to an increase in the partial pressure of the noble gas and/or hydrogen. During the total time, which is chosen such that the desired coating thickness is achieved, each the coating periods may range between, say 1 s and 20 min, preferably between 2 s and 2 min, while the hydrocarbon supply may be interrupted for a period between 1 s and 10 min, preferably between 1 s and 1 min.

The hydrocarbons used may be any saturated or unsaturated hydrocarbons, if possible with no more than 10 hydrocarbon atoms, e.g. acetylene, ethylene, methylalcohol and the like. Pure hydrogen and pure noble gases are used according to the invention. All working gases can be mixed and admitted in the specified composition or are individually supplied to the discharge chamber where they are mixed.

According to the invention, the coating apparatus, e.g. a diode unit, a triode unit or a thermally assisted triode unit but also magnetic-field-assisted units, is, if possible, evacuated to a pressure of less than $2 \times 10^{-5}$ mbar. Thereupon, the working gases are admitted in the desired mixing ratio.

The process is carried out dynamically, i.e. gas supply is controlled such that the working pressure indicated above is reached while the vacuum pump is in operation. After the working pressure has been adjusted, plasma discharge is ignited which upon proper process control, burns homogenously around the substrate to be coated. Normally, high-frequency excitation is used to sustain plasma discharge.

The working gases are excited, dissociated and ionized in the coating chamber. By the negative bias voltage at the substrate precleaned in a conventional manner, the ions are attracted by the substrate from the coating chamber. They impinge with a sufficiently high energy to that the crystal lattice of the coating assumes an at least partial diamond structure.

The measures covered by the invention permit the production of transparent, clear and uncolored coatings even in the visible spectrum. On the other hand, higher coating thicknesses can be generated because the coatings deposited according to the method covered by the invention have lower internal stresses. The diamond-like carbon coatings also show a high hardness of more than 3,500 HV, a high resistivity of up to $10^{-15}$ $\Omega$cm, a low friction coefficient mainly in vacuum, which qualifies them in an outstanding manner also for space applications. In addition the method according to the invention features a high growth rate of up to 10 $\mu$m per second. Since the substrates can be coated all-round in the vacuum without rotation, it is possible simultaneously to coat large numbers of parts during one coating cycle.

The invention is described in further detail by way of following examples:

EXAMPLE 1

A glass sheet, $5 \times 5$ cm in size, which was intended as substrate for the carbon coating, was cleaned in an ultrasonic bath by means of solvents, rinsed with distilled water and cleaned again for 15 min each in two ultrasonic bath using acetone and methanol, respectively.

The glass sheet then was placed in a commercial coating apparatus which was evacuated to a residual gas pressure of less than about $2 \times 10^{-5}$ mbar, and ion-etched for 10 min at a discharge voltage of 400 V, argon at a partial pressure of $5 \times 10^{-3}$ mbar being admitted. Thereupon, the apparatus was evacuated to the pressure indicated above. The following gases were admitted into the apparatus up to the partial pressures indicated: acetylene ($2 \times 10^{-3}$ mbar), hydrogen ($1 \times 10^{-3}$ mbar) and argon ($3 \times 10^{-3}$ mbar). The discharge voltage was adjusted at 300 V. After a coating period of 25 min, a firmly adhering hard coating was obtained which was transparent even in the visible spectrum, had a thickness of 0.5 $\mu$m and showed low internal stress.

EXAMPLE 2

A glass cylinder with a diameter of 3.5 mm and a length of 25 mm was cleaned as described in Example 1. After evacuation of the coating apparatus to the values indicated in Example 1, the following gases were admitted: ethylene ($3 \times 10^{-3}$ mbar) and hydrogen ($1 \times 10^{-3}$ mbar). The discharge voltage amounted to 150 V. The coating period was 40 min. The coating thickness totalled 3 $\mu$m. The coating adhered very firmly and was very hard.

EXAMPLE 3

A stainless steel sheet $18 \times 18$ mm in size was cleaned according to the procedure described in Example 1. After evacuation of the apparatus, the following gases were admitted: acetylene ($8 \times 10^{-3}$ mbar), hydrogen ($8 \times 10^{-4}$ mbar), and argon ($1 \times 10^{-3}$ mbar). The discharge voltage was 200 V. After a coating time of 10 min the acetylene supply was switched off for 2 min, and the partial pressure of hydrogen was increased to $5 \times 10^{-3}$ mbar and that of argon to $8 \times 10^{-3}$ mbar. This procedure was repeated 15 times. The coating thickness totalled 4.5 $\mu$m. The coating was very hard and free of internal stress.

We claim:

1. Method of producing diamond-like carbon coatings in which hydrocarbons and hydrogen, possible in the presence of a noble gas, are ionized by plasma discharge, comprising placing a substrate to be coated in a coating apparatus and evacuating the apparatus to a residual gas pressure of below $2 \times 10^{-5}$ mbar, then passing a hydrocarbon gas or a mixture of hydrocarbon gases and pure hydrogen onto the substrate to be coated which is at room temperature or cooled down to $-100°$ C., and producing around the substrate an oxygen-free plasma discharge by high-frequency excitation which is sustained by the gases admitted, the gases being excited, dissociated, ionized and accelerated toward the substrate during the plasma discharge, wherein the partial pressure of the hydrocarbon gas is adjusted between $10^{-3}$ and 1 mbar.

2. Methods as claimed in claim 1 wherein the ratio of the partial pressures of hydrocarbons:hydrogen being between 0.05 and 20.

3. Method as claimed in claim 1 wherein the ratio of the partial pressures of hydrocarbon:hydrogen being between 0.5 and 10.

4. Method as claimed in claim 1 wherein the ratio of the partial pressures of hydrocarbon:noble gas ranges between 0.1 and 10.

5. Method as claimed in claim 4 wherein the noble gas is argon and the ratio for the partial pressures of hydrocarbon:argon is between 1 and 5.

6. Method as claimed in claim 1 wherein the substrate to be coated is cooled down to $-100°$ C.

7. Method as claimed in claim 6 wherein the substrate to be coated is cooled down to 10° to 20° C.

8. Method as claimed in claim 1 wherein plasma discharge is carried out at a voltage of 50 to 600 V.

9. Method as claimed in claim 8 wherein plasma discharge is carried out at a voltage of 150 to 250 V.

10. Method as claimed in claim 1 wherein frequencies in the kilohertz to megahertz range, preferably between 30 KHz and 14 MHz, are used for plasma discharge.

11. Method as claimed in claim 10 wherein frequencies between 30 KHz and 14 MHz are used for plasma discharge.

12. Method as claimed in claim 1 wherein coating is carried out intermittently, during the temporary interruptions of the coating process the hydrocarbon supply being discontinued so that the substrate is bombarded with noble gas and/or hydrogen.

13. Method as claimed in claim 1 wherein the substrate is coated during 1 s. to 20 min., that the admission of hydrocarbons is interrupted during 1 s. to 10 min. and that this procedure is repeated until the desired film thickness is achieved.

14. Method as claimed in claim 13 wherein the substrate is coated during 2 s. to 2 min., that the admission of hydrocarbons is interrupted during 1 s. to 1 min. and that this procedure is repeated until the desired film thickness is achieved.

* * * * *